US010088756B2

(12) United States Patent
Kerssemakers et al.

(10) Patent No.: US 10,088,756 B2
(45) Date of Patent: Oct. 2, 2018

(54) LITHOGRAPHIC APPARATUS AND METHOD

(71) Applicant: ASML Netherlands B.V., Veldhoven (NL)

(72) Inventors: Sander Kerssemakers, Veldhoven (NL); Wilhelmus Petrus De Boeij, Veldhoven (NL); Gerben Frank De Lange, Best (NL); Christiaan Alexander Hoogendam, Veldhoven (NL); Petrus Franciscus Van Gils, Berkel-Enschot (NL); Jelmer Mattheüs Kamminga, Tilburg (NL); Jan Jaap Kuit, Veldhoven (NL); Carolus Johannes Catharina Schoormans, Hooge Mierde (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/321,184

(22) PCT Filed: Jun. 4, 2015

(86) PCT No.: PCT/EP2015/062504
§ 371 (c)(1),
(2) Date: Dec. 21, 2016

(87) PCT Pub. No.: WO2016/005117
PCT Pub. Date: Jan. 14, 2016

(65) Prior Publication Data
US 2017/0199467 A1 Jul. 13, 2017

(30) Foreign Application Priority Data

Jul. 8, 2014 (EP) .................................... 14176184
Sep. 15, 2014 (EP) .................................... 14184775

(51) Int. Cl.
*G03F 7/20* (2006.01)

(52) U.S. Cl.
CPC .......... *G03F 7/70425* (2013.01); *G03F 7/707* (2013.01); *G03F 7/70433* (2013.01); *G03F 7/70716* (2013.01)

(58) Field of Classification Search
None
See application file for complete search history.

(56) References Cited

U.S. PATENT DOCUMENTS 5,705,299 A 1/1998 Tew et al.
6,611,316 B2 8/2003 Sewell
(Continued)

FOREIGN PATENT DOCUMENTS

JP H10-055944 2/1998
JP 11-214302 8/1999
(Continued)

OTHER PUBLICATIONS

International Search Report and Written Opinion dated Sep. 23, 2015 in corresponding International Patent Application No. PCT/EP2015/062504.
(Continued)

*Primary Examiner* — Michelle M Iacoletti
(74) *Attorney, Agent, or Firm* — Pillsbury Winthrop Shaw Pittman LLP

(57) ABSTRACT

A lithographic apparatus comprising a support structure configured to be moved by a first scan distance during a single scanning operation when supporting a patterning device having a first extent in the scanning direction and to be moved by a second scan distance during a single scanning operation when supporting a patterning device having a second extent in the scanning N direction, and a substrate table configured to be moved by a third scan distance during
(Continued)

a single scanning operation when the support structure supports a patterning device having the first extent in the scanning direction and to be moved by a fourth scan distance during a single scanning operation when the support structure supports a patterning device having the second extent in the scanning direction.

23 Claims, 6 Drawing Sheets

(56) References Cited

U.S. PATENT DOCUMENTS

| | | |
|---|---|---|
| 9,140,999 B2 | 9/2015 | Van Der Veen |
| 2002/0123012 A1 | 9/2002 | Sewell |
| 2005/0196680 A1 | 9/2005 | Bouche et al. |
| 2006/0203214 A1* | 9/2006 | Shiraishi ............... G02B 27/28 355/52 |
| 2008/0106716 A1 | 5/2008 | Yamaguchi |
| 2010/0091257 A1 | 4/2010 | Williamson et al. |
| 2013/0128250 A1 | 5/2013 | Van Der Veen |

FOREIGN PATENT DOCUMENTS

| | | |
|---|---|---|
| JP | 2001-244313 | 9/2001 |
| JP | 2003-007609 | 1/2003 |
| JP | 2003-140318 | 5/2003 |
| JP | 2004-072076 | 3/2004 |
| JP | 2004-247718 | 9/2004 |
| JP | 2004-342803 | 12/2004 |
| JP | 2005-203399 | 7/2005 |
| JP | 2006-005139 | 1/2006 |
| JP | 2007-140057 | 6/2007 |
| JP | 2008-090235 | 4/2008 |
| JP | 2008-233623 | 10/2008 |
| JP | 2011-123223 | 6/2011 |
| JP | 2011-128646 | 6/2011 |
| JP | 2011-164430 | 8/2011 |
| JP | 2013-110407 | 6/2013 |
| JP | 2013-229536 | 11/2013 |
| TW | 201329647 | 7/2013 |
| WO | WO 2014/044670 | 3/2014 |

OTHER PUBLICATIONS

Taiwan Office Action dated Nov. 9, 2016 in corresponding Taiwan Patent Application No. 104119469.
Japanese Office Action dated Oct. 17, 2017 in corresponding Japanese Patent Application No. 2016-573060.
Decision of Refusal issued in corresponding Japanese Patent Application No. 2016-573060, dated Mar. 12, 2018.

* cited by examiner

LITHOGRAPHIC APPARATUS AND METHOD

CROSS-REFERENCE TO RELATED APPLICATIONS

This application is the U.S. national phase entry of PCT patent application no. PCT/EP2015/06254, which was filed on Jun. 4, 2015, which claims the benefit of priority of European patent application no. 14176184.1, which was filed on Jul. 8, 2014 and European patent application no. 14184775.6, which was filed on Sep. 15, 2014, and which are incorporated herein in their entirety by reference.

FIELD

The present invention relates to a lithographic apparatus and a device manufacturing method.

BACKGROUND

A lithographic apparatus is a machine that applies a desired pattern onto a target area of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target area (e.g. comprising part of, one or several dies) on a substrate (e.g. a silicon wafer) that has a layer of radiation-sensitive material (resist). In general, a single substrate will contain a network of adjacent target areas that are successively exposed. Known lithographic apparatus include so-called scanners, in which each target area is irradiated by scanning the pattern through the beam in a given direction (the "scanning"-direction) while synchronously scanning the substrate parallel or anti parallel to this direction.

The number of substrates which may be patterned per hour by a lithographic apparatus (often referred to as throughput) is a key metric of lithographic apparatus. It is desirable to increase the throughput of a lithographic apparatus because this will increase the profitability of that lithographic apparatus.

It is desirable to provide, for example, a lithographic apparatus which operates in a manner that is not taught or suggested by the prior art, and which may allow a throughput increase to be obtained.

SUMMARY

According to a first aspect, there is provided a lithographic apparatus comprising a support structure operable to support a patterning device comprising a patterned area which is capable of imparting a radiation beam with a pattern in its cross-section to form a patterned radiation beam, wherein the support structure is movable in a scanning direction; a substrate table operable to hold a substrate, wherein the substrate table is movable in the scanning direction; and a projection system configured to project the patterned radiation beam onto an exposure region of the substrate. The support structure is operable to support patterning devices having a first extent in the scanning direction and operable to support patterning devices having a second extent in the scanning direction. The support structure is configured to be moved by a first scan distance during a single scanning operation when supporting a patterning device having the first extent in the scanning direction and to be moved by a second scan distance during a single scanning operation when supporting a patterning device having the second extent in the scanning direction. The substrate table is configured to be moved by a third scan distance during a single scanning operation when the support structure supports a patterning device having the first extent in the scanning direction and to be moved by a fourth scan distance during a single scanning operation when the support structure supports a patterning device having the second extent in the scanning direction.

The first extent is different to the second extent. The first scan distance is different to the second scan distance. The third scan distance is different to the fourth scan distance.

In this way, there is provided a lithographic apparatus in which throughput may be increased in comparison to lithographic apparatuses with support structures which are capable of supporting only a patterning devices having a single particular extent in the scanning direction.

Patterning devices having the first extent in the scanning direction may comprise a patterned area of less than or equal to 132 mm. The first scan distance may be at least 132 mm.

Patterning devices having the second extent in the scanning direction may comprise a patterned area of greater than 132 mm and the second scan distance may be at least equal to the second extent.

Patterning devices having the second extent in the scanning direction may support a patterned area having a length of 264 mm or more in the scanning direction.

The support structure may be arranged to support patterning devices having the first extent in the scanning direction comprising a single image field and the lithographic apparatus may be operable to scan the single image field during each scanning operation. The support structure may be arranged to support patterning devices having the second extent in the scanning direction comprising a plurality of image fields disposed adjacent each other in the scanning direction and the lithographic apparatus may be operable to scan each of the plurality of image fields during each scanning operation.

The lithographic apparatus may be operable to expose a single target area of the substrate during each scanning operation when the support structure supports a patterning device having the first extent in the scanning direction and comprising a single image field. The lithographic apparatus may be operable to expose a plurality of target areas of the substrate during each scanning operation when the support structure supports a patterning device having the second extent in the scanning direction and comprising a plurality of image fields. Each of the plurality of target areas may be adjacent one another in the scanning direction.

In this way, the lithographic apparatus of the first aspect is able to scan more than one image filed in a single scanning operation, thereby the number of stepping operations and the total step time. Throughput is therefore increased.

The support structure may be arranged to support patterning devices having the second extent in the scanning direction and comprising a single extended image field and wherein the lithographic apparatus is operable to scan the single extended image field during each scanning operation. The lithographic apparatus may be operable to expose a single extended target area of the substrate during each scanning operation when the support structure supports a patterning device having the second extent in the scanning direction and comprising a single extended image field.

In this way, larger target areas of the substrate may be patterned in a single scanning operation.

The substrate may comprise a plurality of target areas, each target area having a length of between 1 and 26 mm in the non-scanning direction and a length of between 1 and 66 mm in the scanning direction.

The first extent may be 6 inches. The second extent may be 12 inches.

The support structure may be arranged to support a patterning device of length 6 inches and 12 inches in the scanning direction, and of length 6 inches and 12 inches in the non-scanning direction.

The support structure may be arranged to support a patterning device having two sub-patterning devices simultaneously. The patterning devices having the second extent in the scanning direction may comprise a plurality of patterning sub-devices, each patterning sub-device having a respective patterned area. The patterning devices having the second extent in the scanning direction may comprise two patterning sub-devices each having the first extent in the scanning direction. Each sub-patterning device having a length of 6 inches in the scanning direction According to a second aspect, there is provided a method of exposing an exposure region on a substrate using a lithographic apparatus, the method comprising: determining a first property of a patterning device supported by a support structure and determining a scan length in dependence thereon; scanning an exposure slit of radiation in a scanning direction over a patterned area of the patterning device in accordance with the determined scan length; and ascanning an exposure slit of radiation from the patterning device onto the exposure region of the substrate in accordance with the determined scan length.

Determining a first property of the patterning device may comprise determining a length of the patterning device and/or a length of the patterned area in a scanning direction. Determining a first property of the patterning device may comprise determining whether the first patterning device comprises a plurality of patterning sub-devices, and may further comprise determining properties of the patterning sub-devices, such as sizes of respective patterned areas of each patterning sub-devices and separation distances between each patterning sub-device or between the respective patterned areas of each patterning sub-device.

It is to be understood that features described in terms of one aspect or embodiment in the preceding or following description may be used in combination with other aspects or embodiments where appropriate. For example, where an apparatus feature is described it is to be understood that the apparatus feature may be utilised in corresponding methods, and vice versa.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
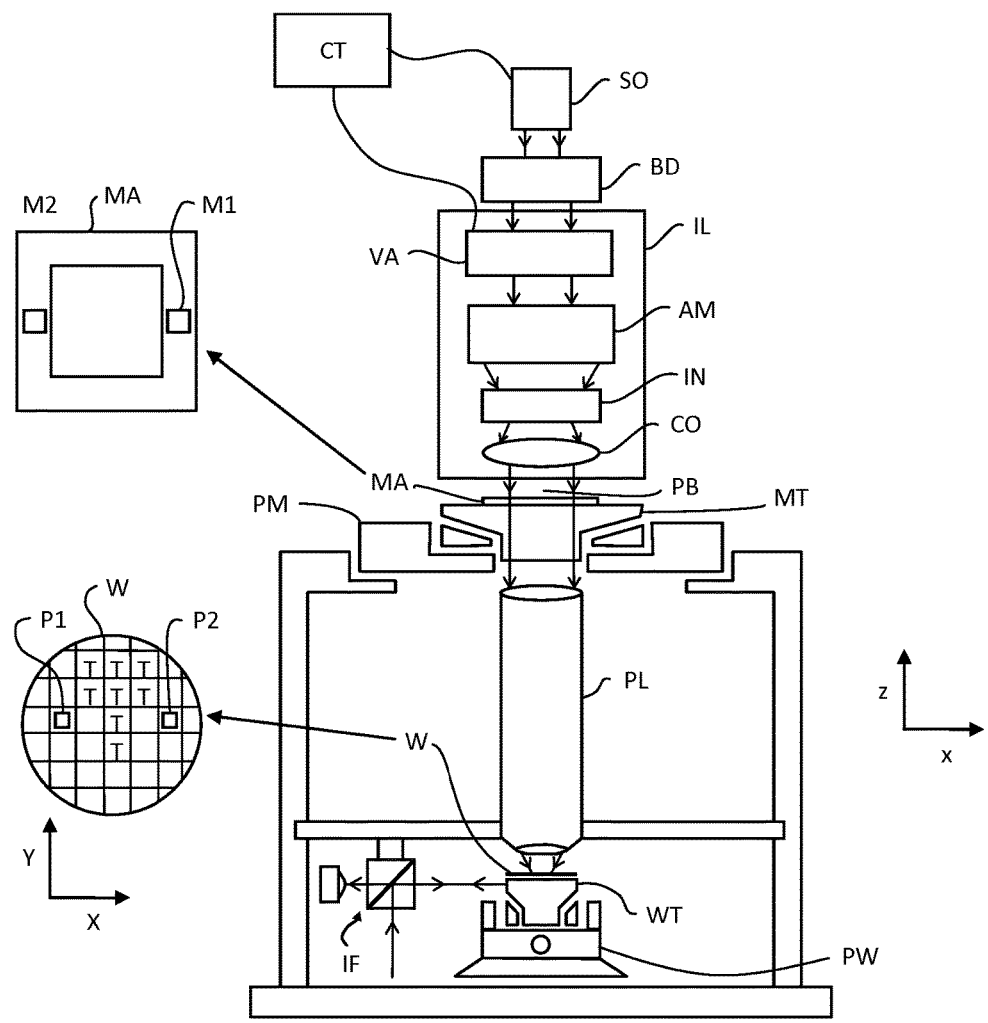
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate", "target area" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target area of the substrate. It should be noted that the pattern imparted to the radiation beam may not exactly correspond to the desired pattern in the target area of the substrate. Generally, the pattern imparted to the radiation beam will correspond to a particular functional layer in a device being created in the target area, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

- an illumination system (illuminator) IL to condition a beam PB of radiation (e.g. UV radiation or EUV radiation).
- a support structure (e.g. a mask table) MT to support a patterning device (e.g. a mask) MA and connected to first positioning device PM to accurately position the patterning device with respect to item PL;
- a substrate table (e.g. a wafer table) WT for holding a substrate (e.g. a resist coated wafer) W and connected to second positioning device PW for accurately positioning the substrate with respect to item PL; and
- a projection system (e.g. a refractive projection lens) PL configured to image a pattern imparted to the radiation beam PB by patterning device MA onto a target area T (e.g. comprising one or more dies) of the substrate W.

As here depicted, the apparatus is of a transmissive type (e.g. employing a transmissive mask). Alternatively, the apparatus may be of a reflective type (e.g. employing a reflective mask or a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as a-outer and a-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target area T of the substrate W. With the aid of the second positioning device PW and position sensor IF (e.g. an interferometric device), the substrate table WT can be moved accurately, e.g. so as to position different target areas C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in a scan mode in which the support structure MT and the substrate table WT are scanned synchronously while a pattern imparted to the beam PB is projected onto a target area T (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction which is perpendicular to the scanning direction) of the target area in a single dynamic exposure, whereas the length of the scanning motion determines the height (in the scanning direction) of the target area.

Figure 2:
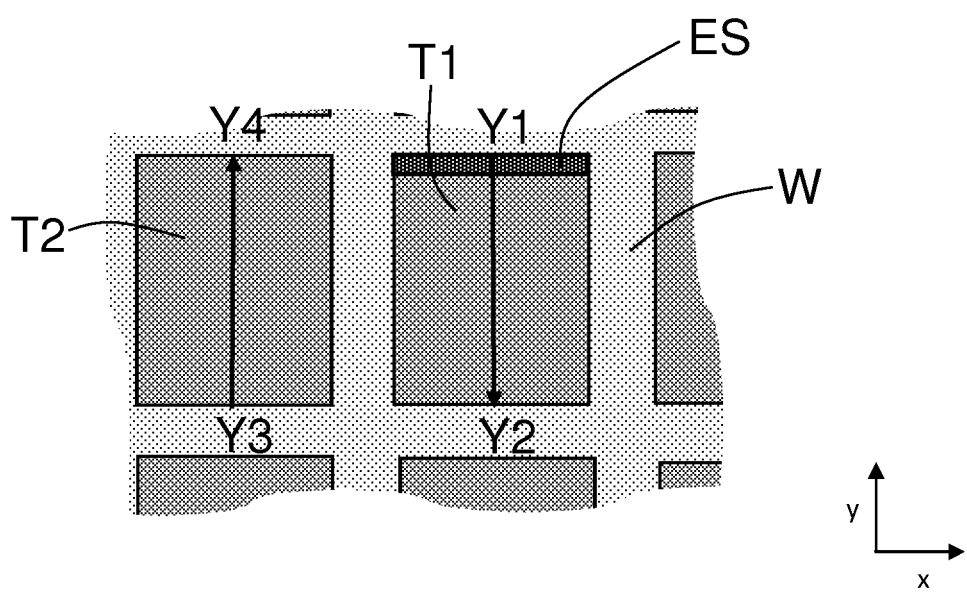
FIG. 2 schematically depicts movement of a substrate during a scanning exposure.

FIG. 2 schematically depicts movement of a substrate W (e.g. a lithographic wafer) during exposure of a pattern onto target areas T1, T2 of the substrate. The substrate W moves beneath the projection system PL (see FIG. 1) during the exposures such that the radiation beam PB projected through the projection system is incident upon target areas T1, T2 in a sequential manner.

The substrate W may be initially positioned such that an area of the patterned radiation beam ES (which may be referred to as an exposure slit) is located at one end of a first target area T1. The substrate W is moved in the y-direction such that the target area T1 moves beneath the exposure slit ES. The exposure slit ES thus moves from one end Y1 of the target area T1 to an opposite end Y2, thereby projecting patterned radiation onto the entire target area. This may be referred to as a scanning exposure. The arrow indicates movement of the exposure slit ES from position Y1 to position Y2. It will be understood that movement of the exposure slit ES which is referred to is movement of the position of the exposure slit relative to the substrate W due to movement of the substrate (the exposure slit being fixed). Although the exposure slit ES is fixed, the scanning exposure may be most easily visualised by reference to movement of the exposure slit relative to the substrate W. The positions Y1-Y4 illustrated in FIG. 2 are merely schematic. It will be appreciated that the exposure slit begins entirely below the Y1 position and finishes entirely above the Y2 position. It will therefore be understood that the scan length is at least equal to the distance between Y1 and Y2 plus the length of the exposure slit in the scanning direction, and that references to the exposure slit ES being at one of the Y1-Y4 positions, this refers to the exposure slit ES being at a position entirely above or below one of the target areas T1, T2.

The patterning device MA (see FIG. 1) is moved in the −y-direction at the same time that the substrate W is moved in the y-direction. The speed of movement of the patterning device may be 4 times greater than the speed of movement of the substrate W in order to accommodate a reduction factor of 4 of the lithographic apparatus (a different speed multiple may be used if a different reduction factor applies). The movement of the patterning device MA is synchronised with the movement of the substrate W such that the pattern projected onto the target area T1 moves with the same velocity as the target area (thereby avoiding smearing of the pattern projected onto the target area).

After the first target area T1 has been exposed, the substrate W is moved in order to allow the second target area T2 to be exposed. Thus, the substrate W is moved in the x-direction until the exposure slit ES is located at one end Y3 of the second target area T2. The substrate W is then moved in the −y-direction such that the second target area T2 moves beneath the exposure slit ES and is thereby exposed. The exposure slit ES thus moves over the second target area T2 from position Y3 to position Y4. Corresponding movement of the patterning device MA (see FIG. 1) in the y-direction takes place synchronously with movement of the substrate W, thereby transferring a pattern from the patterning device to the second target area T2. Although the substrate W moves in the −x-direction between exposures, the patterning device does generally not move in the x-direction (or the −x-direction). With the exception of small correctional movements in the (−)x-direction, movement of the patterning device MA is only in the y-direction and the −y-direction.

Figure 3:
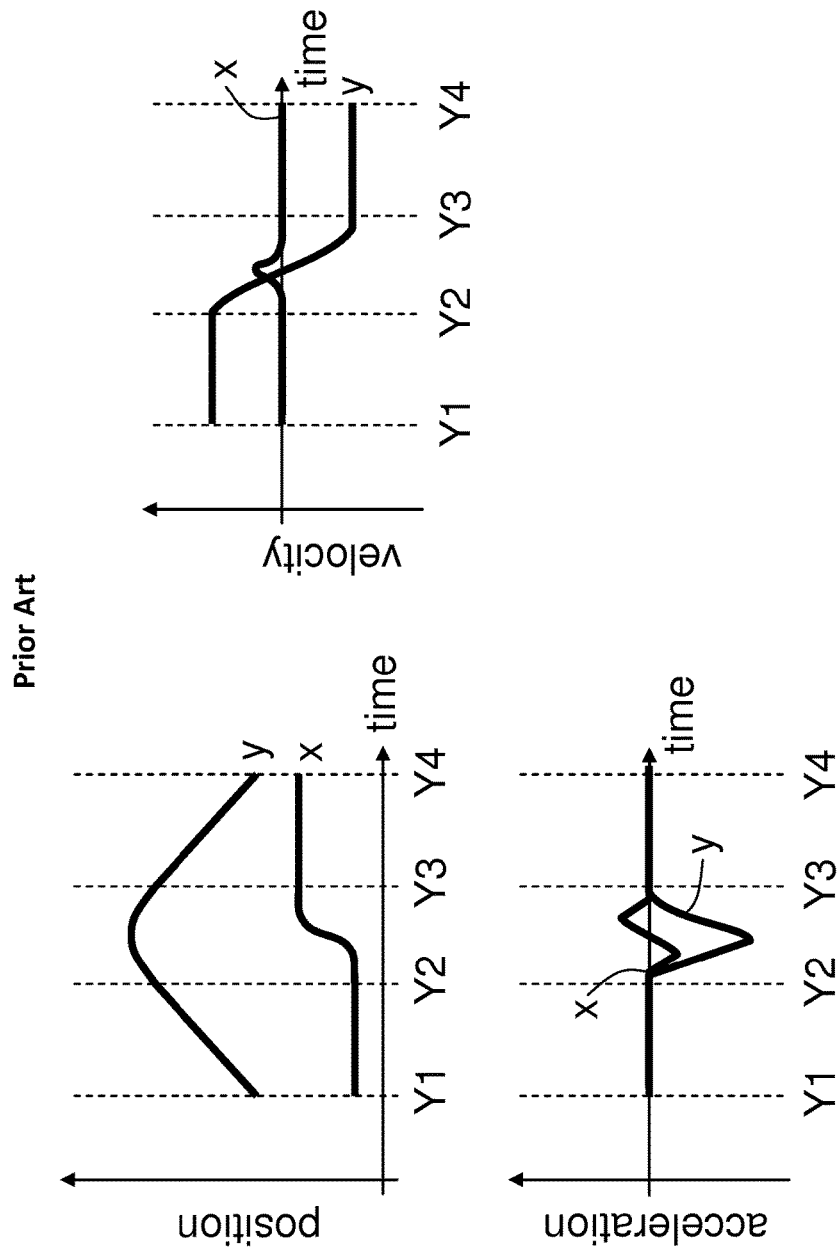
FIG. 3 is a set of graphs which depict movement of a substrate during a prior art scanning exposure.

It is desirable to maximise the throughput of the lithographic apparatus. Therefore, it may be desirable to move the substrate W as quickly as possible from a position Y2 at which the exposure slit ES has finished exposing the first target area T1 to a position Y3 at which the exposure slit ES can begin exposure of the second target area T2. FIG. 3 is a set of graphs which represent the position, velocity and acceleration of the substrate W during exposure of the first and second target areas T1, T2 according to a prior art scanning exposure method. Four positions Y1-Y4 of the substrate are labelled in FIG. 2, and these positions are indicated as a function of time in FIG. 3.

As may be seen from FIG. 3, in a known scanning exposure method the position in the y-direction of the substrate W changes in a linear manner during exposure of the first target area T1. That is, from the position Y1 at which the exposure slit ES begins to illuminate the first target area T1 until the position Y2 at which the exposure slit has finished illuminating the target area, the velocity of the substrate W is constant. As may be seen from the graphs, since the velocity of the substrate is constant between positions Y1 and Y2, the acceleration of the substrate is zero and the position of the substrate varies linearly. The x-direction position of the substrate W does not change during scanning exposure of the first target area T1.

Once scanning exposure of the first target area T1 has been completed, the substrate W is moved in order to allow scanning exposure of the second target area T2 to begin. This movement comprises acceleration of the substrate W in the −y-direction and movement of the substrate in the x-direction. The acceleration in the −y-direction is such that the substrate W stops moving in the y-direction, and then moves in the −y-direction with a velocity which is equal to (although opposite in sign) the velocity during scanning exposure of the first target area T1. The acceleration in the −y-direction is indicated schematically in FIG. 3.

As may be seen from FIG. 3, at the same time that the substrate is accelerated in the −y-direction, an acceleration is applied to the substrate in the x-direction in order to move the substrate in the x-direction. Acceleration in an opposite direction is then applied in order to slow down the substrate in the x-direction, such that x-direction movement of the substrate ceases once the substrate has the correct x-direction position, prior to exposure of the second target area T2 by the exposure slit ES. Exposure of the second target area T2 then takes place, the position of the substrate W in the x-direction being fixed during the exposure.

When scanning exposure of the second target area T2 is taking place, the substrate W has a constant velocity in the −y-direction, as may be seen from FIG. 3.

As will be appreciated from the above, and from consideration of FIG. 3, the substrate W has a constant velocity in the y-direction during a scanning exposure but the sign of the velocity changes between each scanning exposure. The mass of the substrate table WT is significant, and hence substantial forces must be applied to the substrate table in order to achieve the required change of direction between scanning exposures. Actuators which are used to move the substrate table WT will be limited in the amount of force that they are capable of exerting, and hence a significant time is needed in order for the actuators to stop movement of the substrate table in the y-direction and accelerate the substrate table to provide movement with the desired velocity in the −y-direction (and vice versa), while also regularly moving the substrate in the x-direction to a new target area to be exposed. Consequently, a significant period of time may elapse between successive scanning exposures of the substrate. The time elapsed between scanning exposures may be referred to as the 'step time', where each 'step' is a step between target areas of the substrate. This has a negative impact upon the throughput of the lithographic apparatus. It is therefore desirable to minimize the number of steps, the time taken to perform each step, and/or the overall step time when exposing a substrate, in order to increase throughput, by reducing the cycle time of the exposure of the full substrate surface).

It is to be understood that the graphs shown in FIG. 3 are merely exemplary, and provided for illustration only. For example, while in the example of FIG. 3 velocity of the substrate W is equal for each target area T1, T2, this need not be the case. Rather, the velocity of scanning may vary between target areas. For example, target areas which are positioned near to an edge of a substrate W may be scanned with a reduced scan speed. Further, while FIG. 3 illustrates an example in which both the acceleration and velocity in the y-direction is greater than that in the x-direction, this need not be the case. In other examples, the acceleration and velocity of the substrate table WT may be substantially equal in both the x- and y-directions. In other examples, acceleration of the substrate table WT in the x-direction may be greater than acceleration in the y-direction. Similarly, while a relatively short peak velocity of the substrate table WT in the x-direction is depicted in FIG. 3, it will be appreciated that the peak velocity may be maintained for a longer period.

Figure 4:
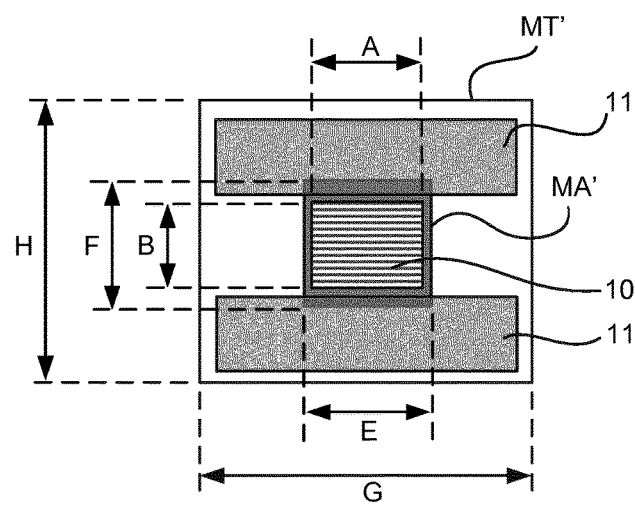
FIG. 4 schematically depicts a support structure according to a prior art embodiment.

FIG. 4 illustrates a prior art support structure MT'. The support structure MT' is arranged to support a patterning device MA'. The patterning device comprises a patterned area 10 having length A in a scanning direction (the x-direction shown by the spatial axes provided in FIG. 4) and length B in a non-scanning direction (the x-direction shown by the spatial axes provided in FIG. 4). The patterning device MA' may be secured to the support structure MT' by clamps positioned at clamping areas 11.

Figure 5:
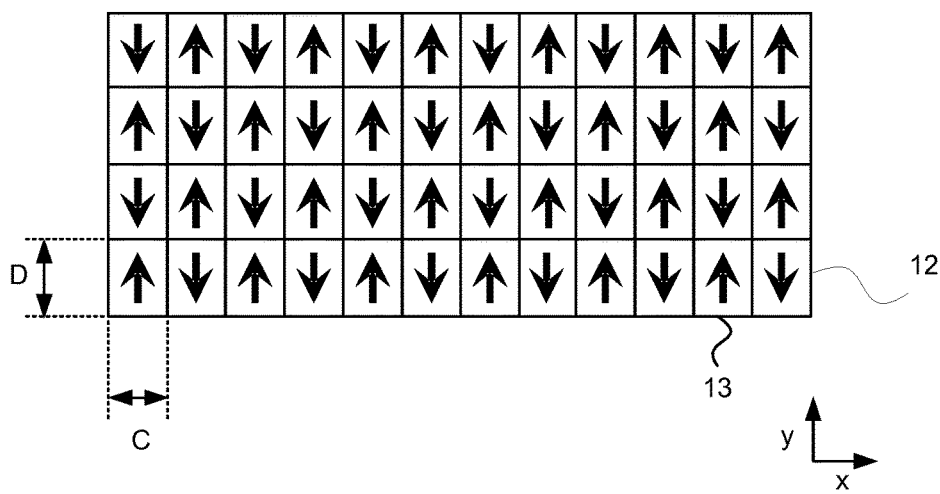
FIG. 5 schematically depicts scanning directions on target areas of a substrate using a known patterning device.

As described above, the illuminator IL directs a conditioned radiation beam at the patterning device so as to impart a pattern, provided on the patterned area, in the cross section of the radiation beam. In particular, with reference to FIG. 4, the radiation beam PB is incident on, and scanned across, the patterned area 10 (over a distance that may be considered to be an example of a first scan distance). The patterned area 10 comprises a single image field carrying an image to be applied to each target area of the substrate. As such, each complete scan of the patterned area 10 of the substrate MA' patterns a single target area of a substrate W' (over a distance that may be considered to be an example of a third scan distance), a portion of which is schematically illustrated in FIG. 5. It will be appreciated that in other examples, a patterned area 10 may comprise multiple fields which are exposed individually, where while one field is exposed the other field(s) is(are) blocked by a masking system.

In FIG. 5, a portion, comprising forty-eight target areas, of the substrate W' is shown. Each target area of the substrate W' has a length C in the non-scanning direction and a length D in the scanning direction. In the example of FIG. 5, during exposure of a first target area 12, the patterning device MA' is moved in the y-direction while the substrate W' is moved in the −y-direction (depicted by an arrow on the target portion 12 facing down the page). After a complete pass of both patterned area 10 (of the patterning device MA') and the target area 12 (of the substrate W'), the substrate table is moved in the −x-direction to line-up the next target area 13 for exposure. During exposure of the target area 13, the patterning device MA' is moved in the −y-direction, while the substrate W' is moved in the y-direction (depicted by an arrow on the target portion 13 facing up the page). Arrows shown on each other target area of the substrate W' indicate the direction of the movement of the substrate during exposure of that target area. It can be seen that the scan direction alternates in the y and −y directions in each scan operation.

In the example of FIG. 5, in which the target areas are processed in order, right-to-left for the first row (starting with the target portion 12), left-to-right for the second row, etc., patterning the forty-eight target areas of the portion of the substrate W' with the image contained within the patterned area 10, requires forty-eight changes in the scanning (y-) direction and forty-four movements in the non-scanning (x-) direction. In general, a substrate may comprise of the order of 100 target areas. It will be appreciated, therefore, that a total step time to pattern a single substrate is significant.

The patterning device MA' has a length E (which may be considered to be an example of a first extent) in the scanning direction and F in the non-scanning direction. The support structure MT' has a length G in the scanning direction and a length H in the non-scanning direction. By way of example only, B may be equal to approximately 104 mm, while A may be approximately equal to 132 mm. The radiation beam PB may be reduced by a factor of 4 between the patterning device MA' and the substrate, such that C may be approximately 26 mm and D approximately 33 mm. A patterned area of dimensions 104 mm by 132 mm is often provided on a patterning device in which E and F are each approximately 152.4 mm (6 inches). G may, for example, be 400 mm and H may be 340 mm. As a further example, C may be approximately 20 mm and D approximately 24 mm.

Figure 6:
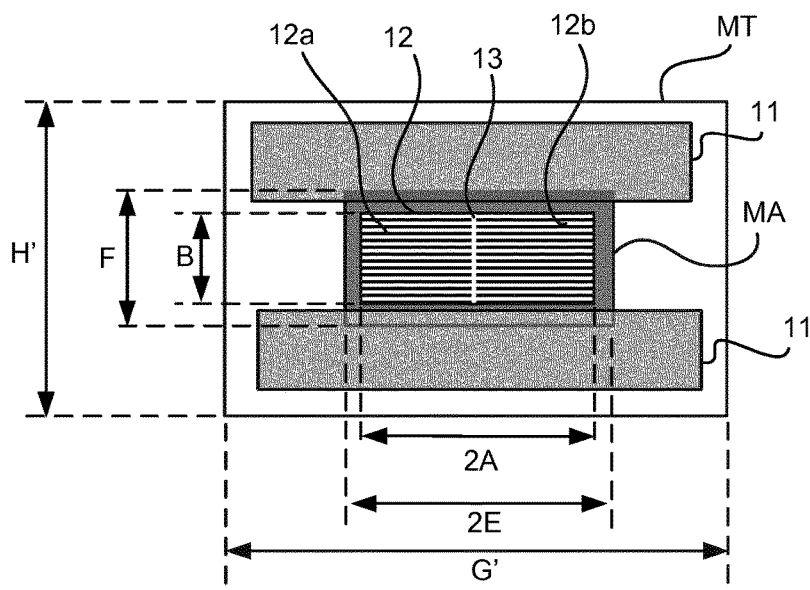
FIG. 6 schematically depicts a support structure supporting an extended patterning device.

FIG. 6 illustrates a support structure MT arranged to support patterning devices in which the patterned area is extended in length in the scanning direction. In particular, the support structure MT is configured to support a patterning device MA. The patterning device MA comprises a patterned area 12. The patterned area 12 has length of approximately 2A in a scanning direction (the y-direction shown by the spatial axes provided in FIG. 6) and length B in the non-scanning direction (the x-direction shown by the spatial axes provided in FIG. 6). That is, the patterned area 12 of the patterning device MA is approximately twice as long in the scanning direction as the patterned area 10 of the patterning device MA'. The patterning device MA may be secured to the substrate table by clamps positioned at clamping areas 11.

The patterning device MA may have length of approximately 2E (which may be considered to be an example of a second extent) in the scanning direction in order to support the longer patterned area 12, and length F in the non-scanning direction. The support structure MT' has length G' in the scanning direction and length H' in the non-scanning direction. As in the above example, B may be approximately 104 mm, while 2A may be approximately 264 mm. G' may, for example be 570 mm and H' may be 360 mm.

In an example embodiment shown in FIG. 6, 2E may be equal to 12 inches while F may be equal to 6 inches. It will be appreciated that, while, in the depicted embodiment, the patterned area 12 and the patterning device MA are twice as long in the scanning direction as the patterned area 10 and the patterning device MA' respectively, the support structure MT need not be twice as long as the support structure MT'. More generally, however, it is to be understood that all of the example dimensions provide above are merely exemplary and may vary. For example, the patterning device MA may be more than twice as long as the patterning device MA'.

As the patterned area 12 of the patterning device MA is twice as long in the scanning direction as the patterned area 10 of the patterning device MA', the laser beam may be scanned over a longer distance (which may be considered to be an example of a second scan distance). In this way, a larger area of the substrate W (which may be considered to be an example of a fourth scan distance) may be exposed in a single scanning operation. In this way, the number of step operations required to expose each target area of the substrate may be reduced, consequently reducing the total step time required to scan multiple target areas.

In the example of FIG. 6, the patterned area 12 comprises two fields 12a, 12b separated by a scribe lane 13. The presence of the scribe lane 13 may cause the patterned area 12 to be more than twice the length of the patterned area 10 in the scanning direction. Each field 12a, 12b may comprise a pattern to be applied to a respective target area of a substrate, while the scribe lane corresponds to scribe lanes 14 (FIG. 7) extending perpendicular to the scanning direction between target portions of the substrate.

Figure 7:
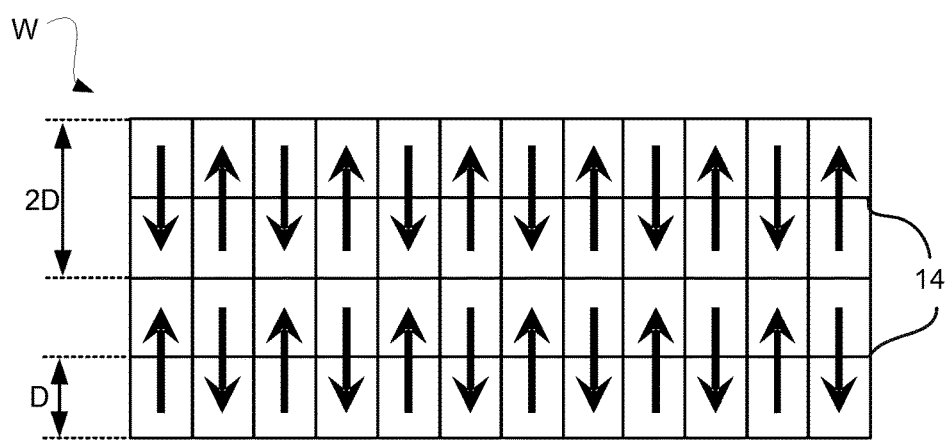
FIG. 7 schematically depicts scanning directions on target areas of a substrate using an extended patterning device.

A portion of a substrate W is schematically illustrated in FIG. 7. Like the portion of the substrate W' shown in FIG.

5, the portion of the substrate W shown in FIG. 7 comprises forty-eight target areas of length D (in the scanning direction) by C (in the non-scanning direction). Arrows shown in FIG. 7 illustrate the movement of the substrate W with respect to the patterned laser beam PB during exposure of each target portion. It can be seen, in comparison with FIG. 5, that two target areas may be exposed in a single scanning operation. As such, exposure of the forty-eight target areas of the substrate W requires half the number of changes of direction of movement, in both the y- and x-directions, than exposure of the forty-eight target areas of the substrate W'.

Further, for a fixed maximum acceleration of the support structure MT, because each scanning operation is over a longer distance (which may be referred to as a second scan distance), the velocity at which the patterning device MA may be scanned increases. That is, the support structure MT may accelerate (and decelerate) over a longer distance. The increase in scan speed may provide a further increase in throughput, in addition to that provided by the reduction in the number of steps. The maximum acceleration of the support structure MT may be limited by actuators used to accelerate the support structure MT. Additionally, a maximum, or optimal, acceleration may be influenced by clamping methods used to secure the patterning device MA to the support structure MT. For example, acceleration of the support structure MT may be limited to prevent slippage of the patterning device MA during scanning.

While the patterned area 12 comprises two fields 12a, 12b separated by a scribe lane 13, in other embodiments, the patterned area may comprise a single, longer patterned area. For example, the patterned area 12 may comprise a single patterned area of length 2A. In this case, the substrate may comprise target portions of length 2D in the scanning direction. That is, with reference to FIG. 7, the boundaries 14 may be removed, providing larger target areas.

The support structure MT may be adapted for receipt of patterning devices having different dimensions. For example, while a larger patterning area may be advantageous, 6×6 inch patterning devices are widely used and a large stock of existing 6×6 inch patterning devices exists. In order to accommodate existing patterning devices, in some embodiments, the support structure MT may adapted for support of 6×6 inch patterning devices.

Figure 8:
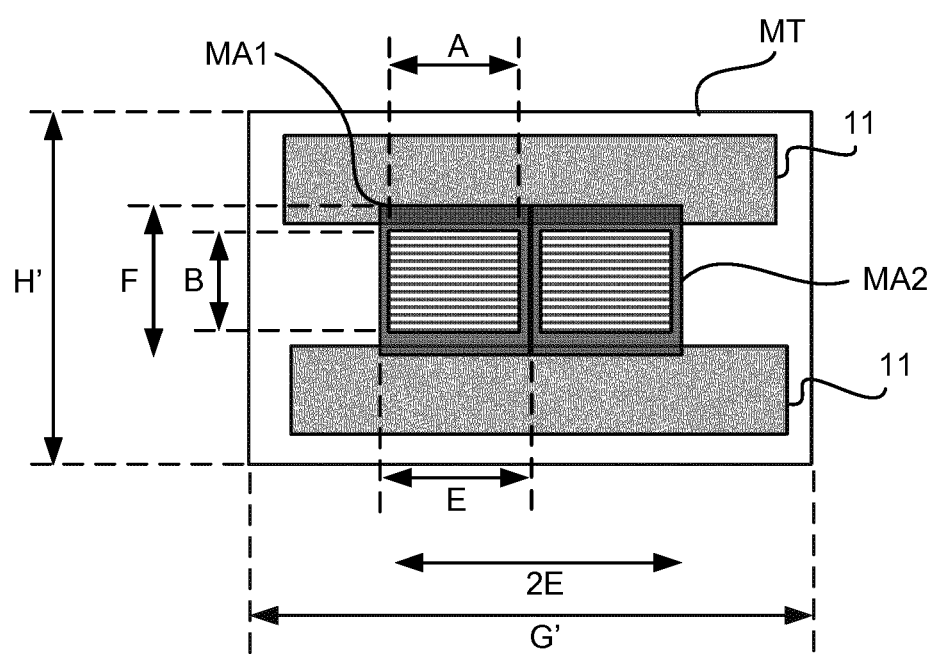
FIG. 8 schematically depicts a support structure supporting two patterning devices simultaneously.

That is, in some embodiments, the support structure MT is capable of supporting both the patterning device MA (which may be, for example, 6×12 inches) and the patterning device MA' (which may be 6×6 inches). For example, different patterning devices, of differing sizes, may be used with the support structure MT to scan different substrates, or different layers of a substrate. More generally, therefore, the support structure may be configured to support patterning devices having both a first extent in the scanning direction and a second extent in the scanning direction.

Where the support structure is extended to support an extended patterning device, the support structure MT may additionally be configured to support more than one patterning device of standard size (for example, more than one 6×6 inch patterning device). By providing the ability to accept multiple patterning devices, time taken in exchanging patterning devices may be reduced, thereby further improving throughput. FIG. 8 schematically illustrates the support structure MT supporting two patterning devices, MA1, MA2, each having a respective patterned area. The patterning devices MA1, MA2 may be thought of as providing a patterning device having two patterning sub-devices.

Where an extended support structure MT supports a single patterning device of standard size, the single patterning device may be positioned at any position along the scanning direction on the support structure. It may be preferable however, to position a single patterning device in a central position on the support structure, to facilitate control and improve the support structure MT dynamics.

It may be desirable to provide an extended patterned area (e.g. of dimensions 2A×B) on a substantially square patterning device. In particular, patenting device manufacturing methods may be such that square patterning devices are required or desired. For example, a 12×12 inch patterning device may be provided, carrying a patterned area of dimensions 2A×B. In this case, a patterned area (equivalent to the patterned area 12) may be provided on a central portion of the 12×12 inch patterning device. The support structure MT may therefore also be adapted for receipt of 12×12 inch patterning devices.

Where the support structure MT is adapted to support a patterning device of 12×12 inches, the support structure MT may have a length of 540 mm in the non-scanning direction and a length of 600 in the scanning direction. A larger support structure may be provided to allow for larger clamping areas to better support the larger patterning device.

Where the support structure MT is capable of receiving a plurality of patterning devices of differing sizes, software controlling the scanning operation of the lithographic apparatus may be configured to perform different scanning procedures in dependence upon the particular patterning device that is in use. For example, a setting may be selected manually by an operator the lithographic apparatus. Alternatively or additionally, each patterning device may comprise a marking or signal (such as a barcode, QR code, RFID tags, etc.) which may be automatically read and processed. Alternatively or additionally, sensing apparatus (such as optical, acoustic, etc.) may be provided to monitor the support structure MT and automatically determine the dimensions of the patterning device in use. In response to determining the dimensions of the patterning device, scan settings including a scan speed, a scan length, step operations, etc., may be selected.

For example, in a first scanning operation, it may be determined that the support structure MT supports a patterning device MA' having a standard patterned area 10 (e.g. a first extent in the scanning direction). In this case, software controlling the scanning operation may select a first scan distance for the support structure of, for example, 132 mm to be performed at a first scan speed, and a third scan distance of the substrate table WT. Upon detection of the replacement of the patterning device MA' with a patterning device MA, the software controlling the scanning process may determine that the patterning device MA comprises an extended patterned area 12 (e.g. a second extent in the scanning direction), and subsequently select a second (increased) scan distance for the support structure (e.g. 264 mm) and an increased scan speed, together with a fourth (increased) scan distance for the substrate table WT.

Patterning devices MA', MA, may be supplied to the support structure MT by a patterning device handling system (not shown). The patterning device handling system receives patterning devices from an operator, or from an automated fabrication system, and delivers the patterning device to the support structure MT. Where the support structure MT is configured to support patterning devices of multiple sizes, a patterning device handling system configured to supply the support structure MT may equally be configured to receive and handle patterning devices of differing sizes. Similarly, the patterning device handling system may be adapted to supply multiple, standard size, patterning devices to the support structure.

In a conventional lithographic apparatus the direction of scanning movement of the patterning device may be opposite to the direction of scanning movement of the substrate. However, it is possible that the direction of scanning movement of the patterning device is the same as the direction of scanning movement of the substrate. Embodiments of the invention may encompass both of these possibilities.

While specific embodiments of the invention have been described above, it will be appreciated that the invention may be practiced otherwise than as described. The description is not intended to limit the invention.

The invention claimed is:

1. A lithographic apparatus comprising:
a support structure configured to support a patterning device comprising a patterned area which is capable of imparting a radiation beam with a pattern in its cross-section to form a patterned radiation beam, wherein the support structure is movable in a scanning direction and wherein the support structure is configured to support a first patterning device having a patterned area with a first extent in the scanning direction, the first patterning device having a first dimension in a first direction across the outer peripheral shape of the first patterning device when supported on the support structure, the first dimension reaching opposite edges of the outer peripheral shape of the first patterning device and the support structure is configured to support a second patterning device having a patterned area with a second extent in the scanning direction, the second patterning device having a second dimension in the same direction as the first direction across the outer peripheral shape of the second patterning device when supported on the support structure, the second dimension reaching opposite edges of the outer peripheral shape of the second patterning device, the second extent being different to the first extent and the first dimension being different to the second dimension;
a substrate table configured to hold a substrate, wherein the substrate table is movable in the scanning direction;
a projection system configured to project the patterned radiation beam onto an exposure region of the substrate; and
a control system configured to cause:
the support structure to be moved by a first scan distance during a single scanning operation when supporting the first patterning device and to be moved by a second scan distance during a single scanning operation when supporting the second patterning device, the first scan distance being different to the second scan distance, and
the substrate table to be moved by a third scan distance during a single scanning operation when the support structure supports the first patterning device and to be moved by a fourth scan distance during a single scanning operation when the support structure supports the second patterning device, the third scan distance being different to the fourth scan distance.

2. The lithographic apparatus of claim 1, wherein the first patterning device comprises a patterned area with a length less than or equal to 132 mm in the scanning direction and wherein the first scan distance is at least 132 mm.

3. The lithographic apparatus of claim 2, wherein the second patterning device supports a patterned area having a length of 264 mm or more in the scanning direction.

4. The lithographic apparatus of claim 1, wherein the second patterning device comprises a patterned area with a length greater than 132 mm in the scanning direction and wherein the second scan distance is at least equal to the second extent.

5. The lithographic apparatus of claim 1, wherein the support structure is arranged to support a single image field when the support structure supports the first patterning device and the lithographic apparatus is configured to scan the single image field during each scanning operation, and
wherein the support structure is arranged to support a plurality of image fields disposed adjacent each other in the scanning direction when the support structure supports the second patterning device and the lithographic apparatus is configured to scan each of the plurality of image fields during each scanning operation.

6. The lithographic apparatus of claim 5, wherein the lithographic apparatus is configured to expose a single target area of the substrate during each scanning operation when the support structure supports the first patterning device and a single image field, and
wherein the lithographic apparatus is configured to expose a plurality of target areas of the substrate during each scanning operation when the support structure supports the second patterning device and a plurality of image fields, each of the plurality of target areas being adjacent one another in the scanning direction.

7. The lithographic apparatus of claim 1, wherein the support structure is arranged to support a single extended image field when the support structure supports the second patterning device and wherein the lithographic apparatus is configured to scan the single extended image field during each scanning operation.

8. The lithographic apparatus of claim 7, wherein the lithographic apparatus is configured to expose a single extended target area of the substrate during each scanning operation when the support structure supports the second patterning device and a single extended image field.

9. The lithographic apparatus of claim 1, wherein the substrate comprises a plurality of target areas, each target area having a length of between 1 and 26 mm in the non-scanning direction and a length of between 1 and 66 mm in the scanning direction.

10. The lithographic apparatus of claim 1, wherein the first dimension is 6 inches and the second dimension is 12 inches.

11. The lithographic apparatus of claim 1, wherein the support structure is arranged to support a patterning device of length 6 inches in the scanning direction and/or a patterning device of length 12 inches in the scanning direction, and a patterning device of length 6 inches in the non-scanning direction and/or a patterning device of length 12 inches in the non-scanning direction.

12. The lithographic apparatus of claim 1, wherein the second patterning device comprises a plurality of patterning sub-devices, each patterning sub-device having a respective patterned area.

13. The lithographic apparatus of claim 12, wherein the second patterning device comprises two patterning sub-devices each having the first extent in the scanning direction.

14. A method of exposing an exposure region on a substrate using a lithographic apparatus, the method comprising:
determining a first property of a patterning device supported by a support structure and determining a scan length and velocity in dependence thereon such that a determined first scan length would have a first velocity and a determined second different scan length would have a second different velocity;

scanning an exposure slit of radiation in a scanning direction over a patterned area of the patterning device in accordance with the determined scan length and velocity; and scanning an exposure slit of radiation from the patterning device onto the exposure region of the substrate in accordance with the determined scan length and velocity.

15. The method of claim 14, wherein determining a first property of the patterning device comprises determining a length of the patterning device and/or a length of the patterned area in a scanning direction.

16. The method of claim 14, wherein determining a first property of the patterning device comprises determining whether the first patterning device comprises a plurality of patterning sub-devices.

17. The method of claim 14, wherein determining the first property comprises:
   determining that a first patterning device has a first extent in the scanning direction and determining the first scan length for the first patterning device, and
   determining that a second patterning device has a second extent in the scanning direction and determining the second scan length for the second patterning device, the second extent being different to the first extent.

18. The method of claim 17, wherein the first patterning device comprises a patterned area with a length less than or equal to 132 mm in the scanning direction and wherein the first scan length is at least 132 mm.

19. The method of claim 17, wherein the second patterning device comprises a patterned area with a length greater than 132 mm in the scanning direction and wherein the second scan length is at least equal to the second extent.

20. The method of claim 17, wherein the first patterning device comprises a single image field and the single image field is scanned during each scanning operation, and
   wherein the second patterning device comprises a plurality of image fields disposed adjacent each other in the scanning direction and wherein each of the plurality of image fields is scanned during each scanning operation.

21. A lithographic apparatus comprising:
   a support structure configured to support a patterning device comprising a patterned area which is capable of imparting a radiation beam with a pattern in its cross-section to form a patterned radiation beam, wherein the support structure is movable in a scanning direction and wherein the support structure is configured to support a first patterning device having a first extent in the scanning direction and configured to support a second patterning device having a second extent in the scanning direction, the second extent being different to the first extent;
   a substrate table configured to hold a substrate, wherein the substrate table is movable in the scanning direction;
   a projection system configured to project the patterned radiation beam onto an exposure region of the substrate; and
   a control system programmed to cause:
      the support structure to be moved by a first scan distance with a first velocity during a single scanning operation responsive to information indicating that the support structure is supporting the first patterning device and to be moved by a second scan distance with a second velocity during a single scanning operation responsive to information indicating that the support structure is supporting the second patterning device, the first scan distance being different to the second scan distance and the first velocity being different to the second velocity, and
      the substrate table to be moved by a third scan distance during a single scanning operation responsive to information indicating that the support structure supports the first patterning device and to be moved by a fourth scan distance during a single scanning operation responsive to information indicating that the support structure supports the second patterning device, the third scan distance being different to the fourth scan distance.

22. The lithographic apparatus of claim 21, wherein the support structure is configured to support the first patterning device when it has a first dimension in a first direction across the outer peripheral shape of the first patterning device when supported on the support structure, the first dimension reaching opposite edges of the outer peripheral shape of the first patterning device and the support structure is configured to support the second patterning device when it has a second dimension in the same direction as the first direction across the outer peripheral shape of the patterning device when supported on the support structure, the second dimension reaching opposite edges of the outer peripheral shape of the second patterning device and the first dimension being different to the second dimension.

23. A method of exposing an exposure region using a lithographic apparatus, the method comprising:
   supporting, on a support structure movable in a scanning direction, a first patterning device comprising a patterned area which is capable of imparting a radiation beam with a pattern in its cross-section to form a patterned radiation beam, wherein the patterned area of the first patterning device has a first extent in the scanning direction, the first patterning device having a first dimension in a first direction across the outer peripheral shape of the first patterning device when supported on the support structure, the first dimension reaching opposite edges of the outer peripheral shape of the first patterning device;
   causing the support structure to be moved by a first scan distance during a single scanning operation when supporting the first patterning device;
   causing a substrate table supporting a substrate to be moved by a third scan distance during a single scanning operation when the support structure supports the first patterning device as part of transferring of the patterned radiation beam from the first patterning device to the substrate;
   supporting, on the same support structure but at a different time than when supporting the first patterning device, a second patterning device comprising a patterned area which is capable of imparting a radiation beam with a pattern in its cross-section to form a patterned radiation beam, wherein the patterned area of the second patterning device has a second extent in the scanning direction, the second patterning device having a second dimension in the same direction as the first direction across the outer peripheral shape of the second patterning device when supported on the support structure, the second dimension reaching opposite edges of the outer peripheral shape of the second patterning device, the second extent being different to the first extent and the first dimension being different to the second dimension;
   causing the support structure to be moved by a second scan distance during a single scanning operation when supporting the second patterning device, the first scan distance being different to the second scan distance; and causing the substrate table supporting a substrate to be moved by a fourth scan distance during a single scanning operation when the support structure supports the second patterning device, the third scan distance being different to the fourth scan distance.

* * * * *